United States Patent [19]

Smith

[11] Patent Number: 4,714,843
[45] Date of Patent: Dec. 22, 1987

[54] SEMICONDUCTOR CHIP POWER SUPPLY MONITOR CIRCUIT ARRANGEMENT

[75] Inventor: Michael D. Smith, Lewisville, Tex.
[73] Assignee: Thomson Components-Mostek Corporation, Carrollton, Tex.
[21] Appl. No.: 771,319
[22] Filed: Aug. 30, 1985
[51] Int. Cl.$^4$ .......................... G06G 7/10; H03F 1/02; H03K 5/00
[52] U.S. Cl. .................................. 307/491; 307/352; 328/127; 330/9
[58] Field of Search ............... 328/127, 128, 167, 151; 307/491, 353; 330/9; 333/165

[56] References Cited

U.S. PATENT DOCUMENTS

| | | | |
|---|---|---|---|
| 4,393,351 | 7/1983 | Gregorian et al. ................. | 328/127 |
| 4,404,525 | 9/1983 | Amir et al. ............................ | 330/9 |
| 4,429,282 | 1/1984 | Saari ..................................... | 330/9 |
| 4,439,693 | 3/1984 | Lucas et al. .......................... | 330/9 |
| 4,496,858 | 1/1985 | Smith ................................... | 328/127 |
| 4,578,646 | 3/1986 | Maio et al. .......................... | 307/491 |

OTHER PUBLICATIONS

"A Precision Curvature-Compensated DMOS Bandgap Reference", Bang-Sup Song, IEE Journal of Solid State Circuits, vol. SC-18, No. 6, Dec. 1983.

Primary Examiner—Stanley D. Miller
Assistant Examiner—B. P. Davis
Attorney, Agent, or Firm—Roland Plottel

[57] ABSTRACT

A circuit arrangement (13) for monitoring power supplies in N-channel CMOS devices, comprising elements for sampling of a bandgap voltage reference quantity (41), comparing the reference quantity to a monitored power supply voltage level (38), and compensating (49) for the offset voltage produced in the comparator element (31) conducting the comparison.

4 Claims, 5 Drawing Figures

SEMICONDUCTOR CHIP POWER SUPPLY MONITOR CIRCUIT ARRANGEMENT

DESCRIPTION

1. Technical Field

This invention is directed toward the technology of monitoring power supplies in semiconductor chip devices.

2. Background Art

Many semiconductor chip devices employ backup battery circuits in the event of degradation in the level of the supply voltage level VDD. This backup circuit is of course subject to possible degradation in its own right.

Thus, it is necessary and useful to monitor both the supply voltage level VDD and the backup voltage level VBATT provided by the lithium battery or otherwise, and to compare it against a stable reference voltage.

The circuit conducting the comparison of course includes a comparator element to detect whether the level of this voltage supply has fallen below a predetermined threshold level. The comparison threshold for a VDD of about five (5) volts may for example be four (4) volts; the threshold for VBATT at three (3) volts in turn may only be two point five (2.5) volts.

If a drop across the predetermined threshold occurs, the comparator changes state in accordance with its design and sends a logic signal to inhibit reading and writing of all or at least the affected part of the memory device powered by the particular voltage supply.

The level of the supply voltage VDD is typically about five (5) volts. By way of further background, the battery of choice frequently employed with semiconductor memory chips and devices is the lithium battery. In particular, such a battery is used for memory backup purposes in the Mostek MK48Z02 product line. The backup voltage level VBATT is typically lower than the regular supply voltage. In particular, VBATT may be about three (3) volts in level.

Semiconductor memories of many kinds are known. For purposes of this discussion it is useful to consider both P-well and N-well memory devices. While detection of the degradation of supply voltage is relatively easy in P-well memory devices employing "npn" bipolar substrates, detection of such a voltage drop is more difficult in N-well devices.

Detection of voltage supply degradation in P-well memories typically employs bandgap-type comparators to monitor the supply voltage level VDD. This is accomplished by applying the supply voltage VDD being monitored, across a voltage divider comprising a series pair of resistors to establish a set trip voltage for the comparator at about 2.5 volts for example in the case in which the backup voltage supply VBATT at three (3) volts is being monitored. The trip voltage at the node between the series resistors is applied to the base of a "npn" transistor with its emitter producing constant current to ground through a selected emitter transistor and driving the bases of two further "npn" transistors. This drives first and second selected output currents to ground through the corresponding emitter resistors. One of the transistors is a multiple emitter transistor carrying a relatively large current set by a series pair of resistors with a central node. The other has a single emitter resistor and passes a smaller current.

According to this technique, the larger of the output currents is in turn driven through the series resistor pair with the node there between connected to the positive input of a highly sensitive, chopper-stabilized comparator, and the voltage level across the emitter resistor of the low current-value transistor drives the negative or inverting input of the comparator.

With a sufficient difference in input values at the comparator, an output voltage is generated which turns the memory device or chip of interest off, when VDD or VBATT degrades beyond a certain selected level. In particular, the trip voltage can be selected to be twice the energy bandgap voltage of silicon, i.e. twice 1.26 volts. This is done by properly selecting the values of the input resistors to the comparator.

With N-well devices, detection of the degradation in voltage is not so easily accomplished. In particular, the voltage divider comparator circuit used in P-well devices cannot be used for N-well devices, because the direct application of the circuit to N-well devices would reference the comparator to VDD which is subject to degradation.

SUMMARY OF THE INVENTION

The description herein is accordingly directed toward the invention of an arrangement including a stable voltage reference, to enable effective detection of the degradation of the supply voltage level in an N-well type semiconductor memory device below a predetermined reference level. The arrangement includes a comparator effective for sending a logic signal to inhibit read and write with respect to the memory device of interest.

In particular, instead of the comparator bandgap being referenced to the supply voltage level VDD, the comparator employs ground or VSS as its reference.

According to the invention, a switched capacitor arrangement is thus employed to store the reference voltage established by a bandgap reference circuit, and then to compare the reference voltage with the power supply voltage level VCC or battery voltage VBATT. The switched capacitor arrangement employs a signal amplifier acting as an operational amplifier during sampling of the reference voltage, and as a comparator during a subsequent comparison operation. This reduces the overall device count, because the total number of amplifier elements is reduced.

Further, the invention features an auto-zero capability. Auto-zero is accomplished by shorting out any offset voltage level that may develop between operating cycles at the inputs of the comparator.

DETAILED DESCRIPTION OF A BEST MODE FOR CARRYING OUT THE INVENTION

Figure 1:
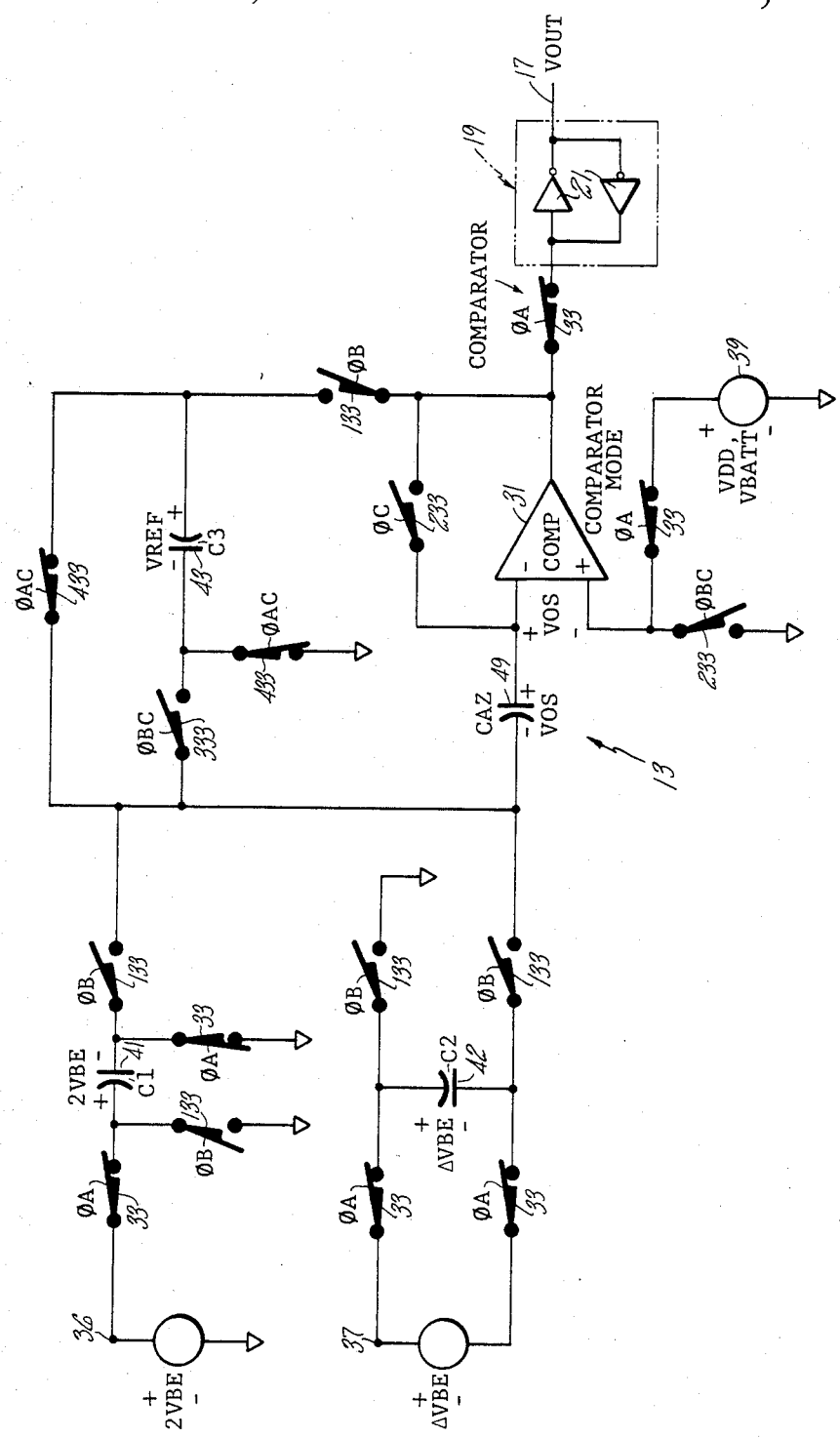
FIG. 1 shows the arrangement of the power supply monitor arrangement according to the invention herein, with "2 VBE" and "delta VBE" being sampled onto corresponding capacitors for storage thereupon.

FIG. 1 shows the circuit arrangement 13, according to the invention herein, in which logic signals "1" or "0" are produced at an output 17, effective for disabling a selected N-well CMOS semiconductor memory device (not shown), which is dependent upon the maintenance of a sufficient voltage level VDD or VBATT at power supply 39, for example within 10 percent of five (5) volts in a preferred embodiment. This logic signal is held at output 17 by a latch 19, which comprises in this case a pair of parallel, oppositely-directed inverters 21.

Figure 5:
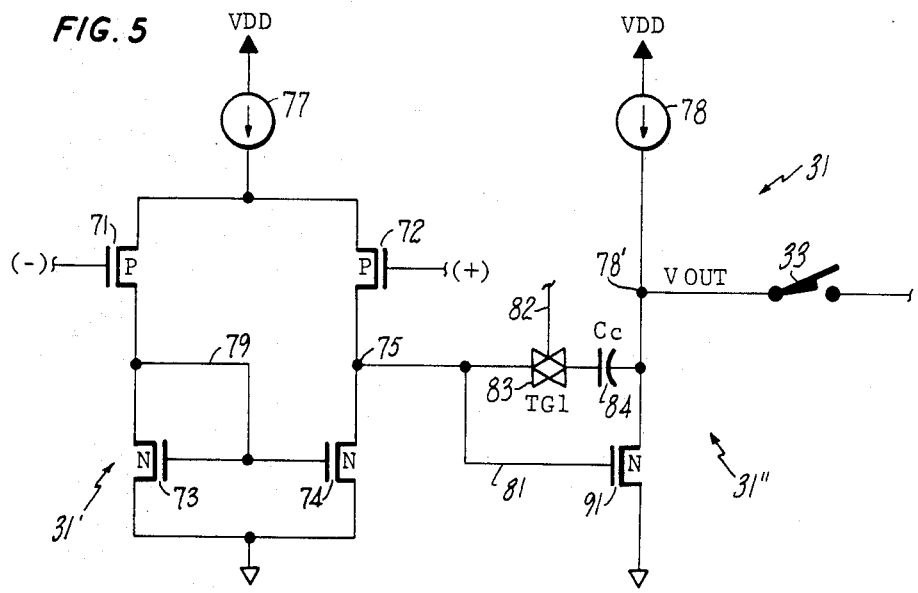
FIG. 5 shows an amplifier configurable for high gain as an operational amplifier, and as a comparator, in accordance with the invention.

During a first mode of operation, amplifier device 31 is configured as a comparator element, as suggested in FIG. 5. Such a logic output is established through switch 33, which is, for example, a transmission gate which is closed during the first phase of operation which can be defined as the period of time during which clock "phi A" is set high to permit the application of the comparator 31 output onto latch 19, and which is open when clock "phi A" is low in order to isolate latch 19 from the output of comparator 31.

During such operation, amplifier 31 produces a non-zero output when VDD, the battery power supply at 39, falls below a predetermined voltage threshold VREF. Voltage VREF is temporarily established on capacitor C3, element 43, for ultimate application on the inverting input to amplifier 31.

With the various switches, 33, 133, 233, 333 and 433, e.g. transmission gates, set open or closed as shown in FIG. 1 (i.e. all the transmission gates 33 and 433 under control of clock "phi A" and "phi AC" being closed, and all the transmission gates 133, 233, and 333 under clocks "phi B", "phi C", and "phi BC" being open), the voltage values "2 VBE" and "delta VBE" shown at respective nodes 36 and 37 are sampled onto respective capacitors C1 and C2, also designated as elements 41 and 42. How to establish voltages "2 VBE" and "delta VBE" will be discussed below with respect to FIG. 4.

Further, during this same clock period "phi A closed" the existing value of VREF on capacitor C3 (i.e. capacitor 43) is compared to VDD or VBATT, as already suggested. Additionally, the output of amplifier 31 is latched onto output lead 17.

More particularly, it is noted that VREF will have been established on C3 during a previous cycle of operation, which is the same as will be discussed below with regard to FIG. 3.

To apply VREF to the inverting input of amplifier 31, gates 433 ("phi AC") adjacent capacitor 43 (i.e C3) are closed. Each such transmission gate 433 is closed during both phase "A" and phase "C". Transmission gate 333 ("phi BC"), on the other hand is open during the evolution shown in FIG. 1, but is in turn closed during both phase "B" and phase "C" of operation, as will be discussed below.

Additionally with regard to FIG. 1, it is noted that selected gates 133 ("phi B") are open during clock phase "phi A" to isolate the two separate evolutions taking place during that operational cycle: namely, sampling 2 VBE and delta VBE onto C1 and C2 respectively; and applying VREF onto the inverting input of amplifier 31 for capacitor 43, the other input thereof being subject for comparison through gate 33 ("phi A") to supply voltage VDD or battery voltage VBATT, depending upon which of the two is monitored by circuit 13.

Figure 2:
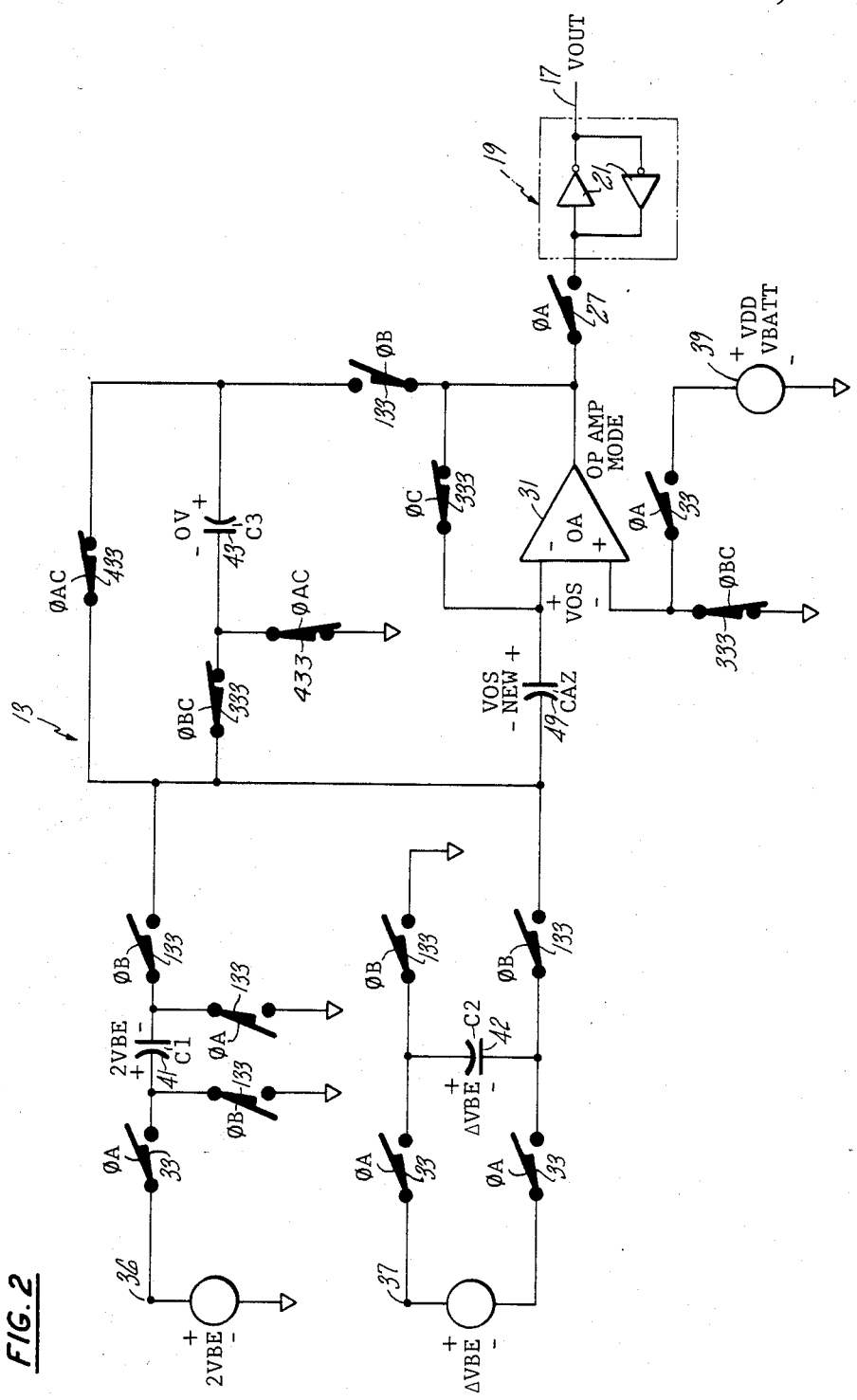
FIG. 2 shows the sample data bandgap comparator circuit arranged to sample the output voltage onto input capacitor CAZ.

FIG. 2 shows the arrangement of FIG. 1 during a subsequent "auto zero" mode of operation in which clock "phi C" is high and switches 333 subject to clock "phi C" are closed. During this mode of operation, voltage "VOS", the difference between the inverting and noninverting inputs to amplifier 31 is sampled onto capacitor CAZ, also referred to as capacitor 49 and thereby in effect compensates for the offset voltage developed in amplifier 31 during sampling. In other words, from cycle to cycle, circuit 13 automatically zeros out the offset voltage by applying a compensating voltage onto CAZ once during every cycle of operation. This is done by setting the bandgap voltage, "2 VBE" plus "delta VBE" equal to zero, i.e. by grounding out one side of CAZ.

In other words, operational amplifier 31 receives a voltage VOS on one side of capacitor 49 (CAZ) opposite the inverting input thereof. Further, the other side of capacitor 49 is grounded through transmission gates 333 as suggested in FIG. 2.

Additionally, to prepare for a next cycle of operation, capacitor 43 is also discharged or grounded.

Figure 3:
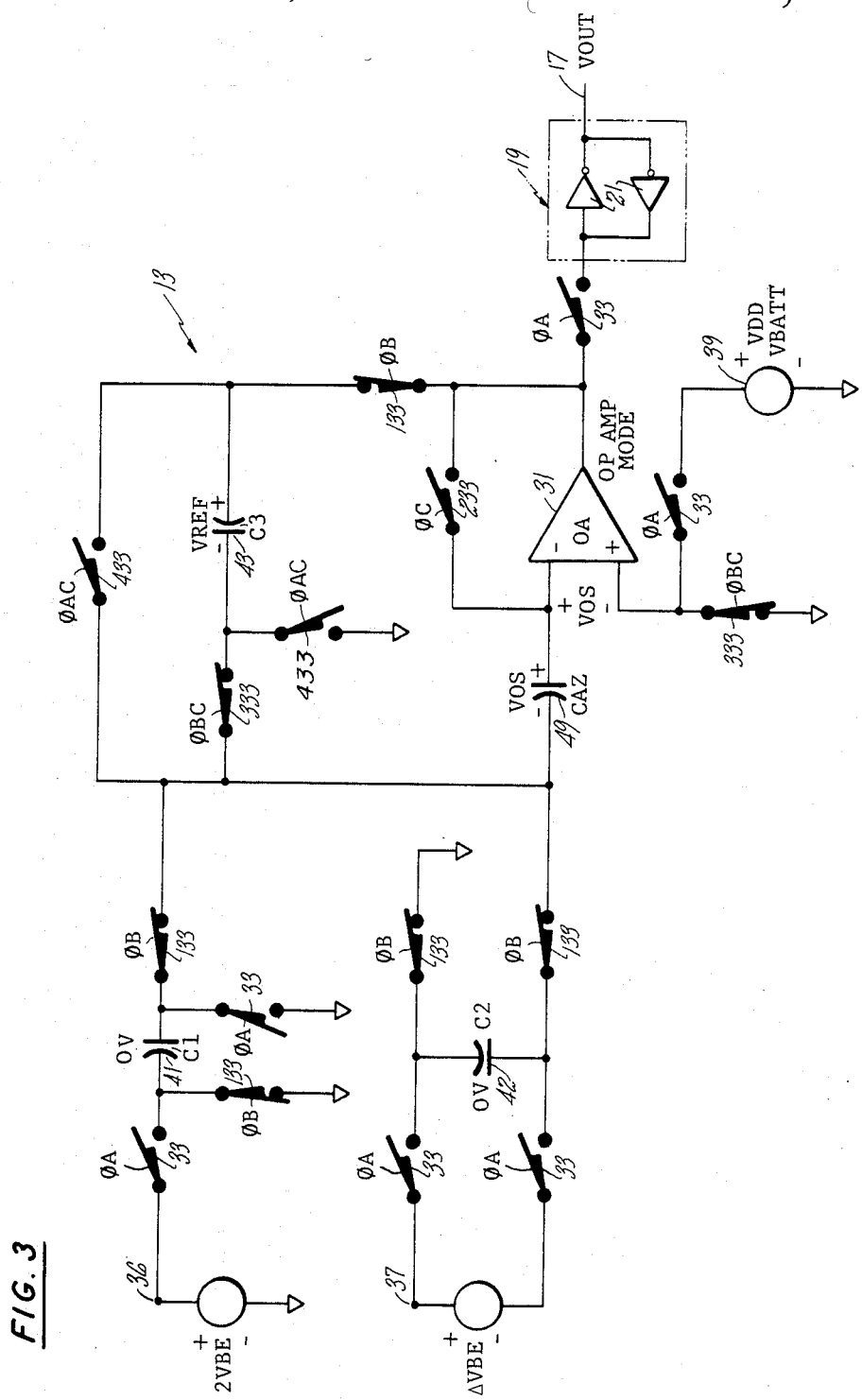
FIG. 3 shows the formation of VREF across the reference capacitor C3.

Next, FIG. 3 shows the arrangement of FIG. 1 and FIG. 2 under a further mode of operation. In this phase, VREF is formed across capacitor C3 by the discharge of capacitors C1 and C2. Further, clock "phi B" is set high and clocks "phi A" and "phi C" are set low.

More particularly, FIG. 3 shows circuit 13 with amplifier 31 acting as an operation amplifier rather than as a comparator as in FIG. 1 and as a disconnected element as shown in FIG. 2. VREF is formed across C3 by adding "2 VBE" from C1 and "delta VBE" from C2, with transmission gates 33 (phi "A") being open and transmission gates 133 (phi "B") being closed.

During this cycle VDD and/or VBATT are held disconnected, and the positive input to amplifier 31 is held grounded.

The offset voltage VOS is maintained on CAZ in anticipation of a next "phi A" cycle.

Figure 4:
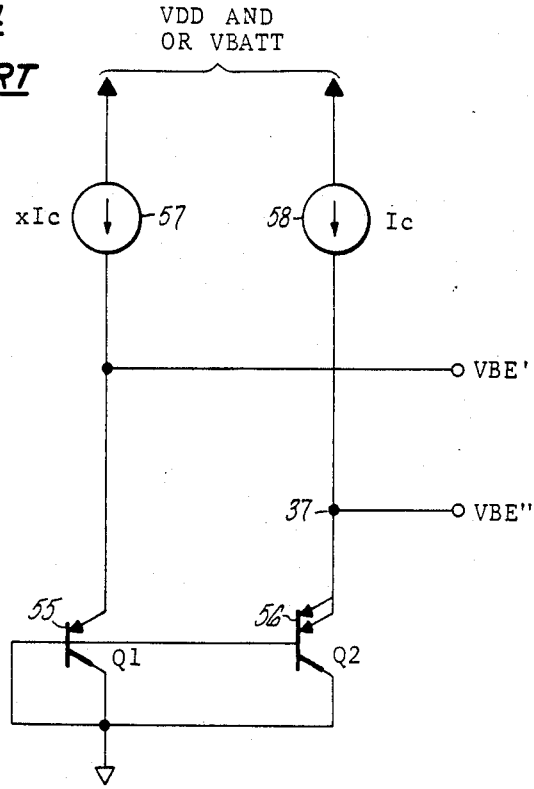
FIG. 4 shows a circuit for establishing first and second "VBE" values, one of which can be set to twice the other, and the difference therebetween.

FIG. 4 shows the establishment of input values "VBE" and "delta VBE" according to the prior art. In particular, a preferred way to establish these respective values is to connect the bases and collectors of two parallel transistors Q1 and Q2 (npn type transistors 55 and 56 for example) to ground, supplying the respective emitters of these transistors with selected different current densities, respectively xIc and Ic, where "x" is a factor by which the current value for input to the emitter of transistor Q1 is selected. Transistor Q2 has a multiple emitter for decreasing the current density with regard to input current level Ic. The emitter of transistor Q1 will accordingly be set to voltage level "1 VBE" and that of the difference between emitter of transistor Q2 and emitter of transistor Q1 will be set to voltage level "delta VBE". The current sources Ic and xIc, respectively 57 and 58, are established simply by inserting suitably sized resistors in series with respective emitters which correspond to the desired current levels. To establish the value of "2 VBE" required for node 36 in FIGS. 1 through 3, two transistors Q1 are placed in series, as is well known in the art.

FIG. 5 shows how to configure amplifier 31 as either a comparator or an operational amplifier, in order to reduce the overall device count.

More particularly, the primary internal details of amplifier 31 are shown in FIG. 5. These include a differential amplifier stage 31' and an output gain stage 31".

The differential amplifier stage 31' includes as is well known in the art, p-channel MOS transistor 71 and 72 respectively connected to power supply VDD through a constant current source 77. These transistors 71 and 72 as shown include gates which constitute the respective inverting and noninverting inputs to amplifier 31, as already discussed.

The differential stage 31' further includes n-channel MOS transistors 73 and 74 which are connected at their drains to VSS or ground. Transistors 73 and 74 are respectively connected at their source connections to the respective sources of p-channel transistors 71 and 72. Further, the gates of the n-channel transistors 73 and 74 are connected to each other as well as to the source of n-channel transistor 73. This connection establishes a current mirror effect which insures that the current through 71 and 73 is the same as the current through transistor 74.

In the gain stage of amplifier 31, an n-channel transistor 91 is drain grounded and provided at its source with a selected constant current level from VDD. The node 78' there between is the output of the amplifier 31, i.e. VOUT. This node is connected to switch 33, which has already been discussed above.

Further, node 78' is connected to stabilizing capacitor "Cc" of controllable transmission gate or switch 83. In other words, for amplifier 31 to act as an operational amplifier, it is important for the amplifier 31 to show high gain and stability. Accordingly, gate 83 is closed and capacitor 84 is connected and active in the circuit for stabilization. Control line 82 directs the action of transmission gate 83, also referred to as "TG1". In any case, the gate of gain transistor 91 is controlled, directed and influenced by the output node 75 of differential amplifier 31'.

The information above is likely to lead individuals skilled in the art to conceive of additional embodiments of the invention, which nonetheless fall within the scope thereof. Accordingly, attention to the claims which follow is urged, as these specify with particularity the metes and bounds of the invention.

I claim:

1. A circuit arrangement for monitoring the power supply of N-well CMOS device comprising
    an amplifier (31) having two inputs including an inverting input,
    a non-inverting input and a single output, and adapted to be switched between modes including a comparator mode and an amplifying mode,
    an output terminal,
    an input terminal to which is applied the supply voltage being monitored,
    a first switch means, serially connected between the output of the amplifying means and the output terminal, which when closed connects the output of the amplifying means to the output terminal,
    a second switch means, connected between the input terminal and one of the two inputs of the amplifying means, which when closed provides a sample of the supply voltage on said one input of the amplifying means,
    a ground terminal,
    a third switch means, connected between the ground terminal and said one input of the amplifying means, which is operated out of phase with said second switch,
    a first capacitor means having first and second terminals across which is periodically stored a reference voltage for comparison with the supply voltage,
    means for periodically storing the reference voltage on said first capacitor means,
    fourth, fifth, sixth, and seventh switch means,
    an input capacitor means including first and second terminals of which said first terminal is connected to the other of the two inputs of the amplifier means, and of which said second terminal is connected to the first terminal of the first capacitor by way of said fifth switch and to the second terminal of the first capacitor means by way of the sixth switch means, said second terminal of the first capacitor means also being connected to the ground terminal by way of the seventh switch means,
    the fourth switch means being connected between the output of the amplifier means and said other input of the amplifier, and
    means for periodically connecting said one terminal of the input capacitor means to the output of the amplifier means.

2. The circuit arrangement of claim 1 in which the sample of the supply voltage is applied to the non-inverting input of the amplifier and the reference voltage and an offset voltage are applied to the inverting input.

3. The circuit arrangement of claim 1 in further combination with means for setting the switches whereby three operating modes of the amplifier means are realized of which during the comparator mode the non-inverting input is connected to the input terminal for applying the supply voltage thereto and the inverting input has applied thereto the voltage across the input capacitor; during a zero offset mode, the non-inverting terminal is connected to ground, the inverting terminal is connected to the output, and the second terminal of the input capacitor is connected to ground whereby a zero offset voltage is stored on the input capacitor, and during the amplifying mode the reference voltage is established across the second capacitor and combined with the zero offset voltage on the input capacitor.

4. The circuit arrangement of claim 1 in further combination with means for setting the switches such that during a first mode the first, second, fifth and seventh switches are closed and the third, fourth and sixth switches open, during a second mode, the first and second are open, and the third, fourth, fifth, sixth and seventh are closed, and a third mode during which the first, second, fourth, fifth and seventh switches are open and the third and sixth switches are closed.

* * * * *